(12) United States Patent
Shima

(10) Patent No.: US 8,846,478 B2
(45) Date of Patent: Sep. 30, 2014

(54) MANUFACTURING METHOD OF SEMICONDUCTOR DEVICE

(71) Applicant: Fujitsu Semiconductor Limited, Yokohama (JP)

(72) Inventor: Masashi Shima, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/017,917

(22) Filed: Sep. 4, 2013

(65) Prior Publication Data

US 2014/0004673 A1  Jan. 2, 2014

Related U.S. Application Data

(60) Division of application No. 13/022,812, filed on Feb. 8, 2011, now Pat. No. 8,552,511, which is a continuation of application No. PCT/JP2008/065179, filed on Aug. 26, 2008.

(51) Int. Cl.
| | | |
|---|---|---|
| *H01L 21/336* | (2006.01) | |
| *H01L 29/66* | (2006.01) | |
| *H01L 29/78* | (2006.01) | |
| *H01L 29/41* | (2006.01) | |
| *H01L 29/08* | (2006.01) | |
| *H01L 29/45* | (2006.01) | |
| *H01L 29/10* | (2006.01) | |
| *H01L 29/49* | (2006.01) | |

(52) U.S. Cl.
CPC ........... *H01L 29/66477* (2013.01); *H01L 29/41* (2013.01); *H01L 29/66659* (2013.01); *H01L 29/0847* (2013.01); *H01L 29/665* (2013.01); *H01L 29/456* (2013.01); *H01L 29/1045* (2013.01); *H01L 29/7835* (2013.01); *H01L 29/4933* (2013.01)
USPC ........... 438/286; 257/371; 257/408; 257/337; 257/392; 257/327; 257/344; 438/234; 438/239; 438/299; 438/264; 438/151

(58) Field of Classification Search
CPC .................... H01L 29/7835; H01L 29/66659; H01L 29/665; H01L 29/7833; H01L 2223/54426; H01L 29/4933; H01L 21/823835; H01L 21/823864; H01L 29/78621
USPC ................. 257/371, 408, 337, 392, 327, 344; 438/234, 286, 239, 299, 264, 151
See application file for complete search history.

(56) References Cited

U.S. PATENT DOCUMENTS 5,362,982 A * 11/1994 Hirase et al. .................. 257/408
5,407,844 A *  4/1995 Smayling et al. ............. 438/234
(Continued)

FOREIGN PATENT DOCUMENTS

| JP | 06-021441 A | 1/1994 |
|---|---|---|
| JP | 8-064689 A | 3/1996 |

(Continued)

OTHER PUBLICATIONS

International Search Report of PCT/JP2008/065179, mailing date Sep. 22, 2008.

(Continued)

*Primary Examiner* — Fernando L Toledo
*Assistant Examiner* — Mohammed Shamsuzzaman
(74) *Attorney, Agent, or Firm* — Westerman, Hattori, Daniels & Adrian, LLP

(57) ABSTRACT

A semiconductor device including a low-concentration impurity region formed on the drain side of an n-type MIS transistor, in a non-self-aligned manner with respect to an end portion of the gate electrode. A high-concentration impurity region is placed with a specific offset from the gate electrode and a sidewall insulating film. The semiconductor device enables the drain breakdown voltage to be sufficient and the on-resistance to decrease. A silicide layer is also formed on the surface of the gate electrode, thereby achieving gate resistance reduction and high frequency characteristics improvement.

9 Claims, 16 Drawing Sheets

(56) References Cited

U.S. PATENT DOCUMENTS

| | | | |
|---|---|---|---|
| 5,814,859 | A | 9/1998 | Ghezzo et al. |
| 6,740,932 | B2 * | 5/2004 | Kikuchi et al. ............... 257/344 |
| 7,098,514 | B2 | 8/2006 | Oh et al. |
| 7,180,132 | B2 | 2/2007 | Cai et al. |
| 7,220,631 | B2 * | 5/2007 | Asada et al. ................. 438/199 |
| 7,439,596 | B2 | 10/2008 | Yoo et al. |
| 7,554,154 | B2 | 6/2009 | Hebert |
| 7,883,960 | B2 | 2/2011 | Fukuda et al. |
| 2002/0094642 | A1 | 7/2002 | Kikuchi et al. |
| 2002/0125531 | A1 | 9/2002 | Kikuchi et al. |
| 2003/0127694 | A1 * | 7/2003 | Morton et al. ................ 257/371 |
| 2004/0075146 | A1 | 4/2004 | Yu |
| 2006/0278924 | A1 | 12/2006 | Kao |
| 2007/0052038 | A1 | 3/2007 | Asada |
| 2007/0102757 | A1 * | 5/2007 | Miyake et al. ................ 257/327 |
| 2007/0108518 | A1 | 5/2007 | Endo et al. |
| 2007/0120184 | A1 | 5/2007 | Cai et al. |
| 2008/0237739 | A1 | 10/2008 | Kurata |
| 2009/0261426 | A1 * | 10/2009 | Feilchenfeld et al. ........ 257/408 |
| 2009/0321824 | A1 | 12/2009 | Shima |
| 2010/0155860 | A1 | 6/2010 | Colombo et al. |
| 2010/0244965 | A1 | 9/2010 | Shima et al. |
| 2011/0042756 | A1 * | 2/2011 | Hikida ........................... 257/392 |
| 2011/0108917 | A1 | 5/2011 | Shima |
| 2011/0108926 | A1 | 5/2011 | Bahl |
| 2011/0221000 | A1 | 9/2011 | Shima |
| 2011/0254087 | A1 * | 10/2011 | Miyake et al. ................ 257/337 |
| 2012/0126319 | A1 | 5/2012 | Feilchenfeld et al. |

FOREIGN PATENT DOCUMENTS

| | | | |
|---|---|---|---|
| JP | 2001-168210 A | | 6/2001 |
| JP | 2001-274259 A | | 10/2001 |
| JP | 2002-217407 A | | 8/2002 |
| JP | 2002-261276 A | | 9/2002 |
| JP | 2005-093458 A | | 4/2005 |
| JP | 2005093458 A | * | 4/2005 |
| JP | 2006-005204 A | | 1/2006 |
| JP | 2006005204 A | * | 1/2006 |
| JP | 2006-216947 A | | 8/2006 |
| JP | 2006-339444 A | | 12/2006 |
| JP | 2007-027641 A | | 2/2007 |
| JP | 2007-067328 A | | 3/2007 |
| JP | 2007067328 A | * | 3/2007 |
| JP | 2007-142041 A | | 6/2007 |

OTHER PUBLICATIONS

Japanese Office Action dated Jan. 29, 2013, issued in corresponding Japanese Patent Application No. 2010-526444, with English translation (13 pages).

Matsuki, T. et al., "Laterally-Doped Channel (LCD) Structure for Sub-Quarter Micron MOSFETs", VLSI Technology, 1991, Digest of Technical Papers, pp. 113-114.

Japanese Office Action dated Jun. 11, 2013, issued in corresponding Japanese Patent Application No. 2010-526444, with Partial English translation (11 pages).

* cited by examiner

MANUFACTURING METHOD OF SEMICONDUCTOR DEVICE

CROSS-REFERENCE TO RELATED APPLICATIONS

This is a divisional application of U.S. patent application Ser. No. 13/022,812, filed on Feb. 8, 2011, which is a continuing application, filed under 35 U.S.C. §111(a), of International Application PCT/JP2008/065179, filed Aug. 26, 2008, the entire contents of which are incorporated herein by references.

FIELD

The present invention relates to a semiconductor device and a manufacturing method thereof.

BACKGROUND

A metal insulator semiconductor (MIS) transistor having a high breakdown voltage is widely available to various types of electronic equipment which needs a relatively high voltage, such as a transmission module included in a mobile terminal for wireless communications.

Various structures have been suggested so that an MIS transistor has a higher breakdown voltage. For example, in one suggested structure, a low-concentration impurity region and a high-concentration impurity region are formed both on the source side and on the drain side across the gate electrode, and the high-concentration impurity region of the drain side is placed with a predetermined offset from the gate electrode (For example, see Japanese Laid-open Patent Publications No. 2005-093458 and No. 08-064689). In another suggested structure, a high-concentration impurity region is formed on the drain side both in a drain-end portion closer to the gate electrode and in a portion placed with a predetermined offset from the drain-end portion (for example, see Japanese Laid-open Patent Publication No. 2005-093458). In these structures, a silicide layer is formed on the surface of the high-concentration impurity region, except the low-concentration impurity region of the offset. Alternatively, a silicide layer is formed continuously on both surfaces of the high-concentration impurity region and the low-concentration impurity region.

Another suggestion has been made for the transistor structure in which an extended drain is formed such as a drain extended metal oxide semiconductor (DEMOS) (for example, see Japanese Laid-open Patent Publication No. 2006-216947).

In an MIS transistor, in the case where a drain-sided high-concentration impurity region is formed with an offset from the gate electrode, the drain breakdown voltage becomes higher, but the on-resistance between the source and the drain increases. In the case where a high-concentration impurity region is formed also in a drain-end portion closer to the gate electrode in order to reduce the on-resistance, the drain breakdown voltage is likely to be insufficient, depending on the gate insulating film thickness and the operating conditions of the MIS transistor.

Such conventional high-breakdown-voltage MIS transistors have been disadvantageous in that the on-resistance increases in exchange for higher breakdown voltage, and that the drain breakdown voltage is insufficient in exchange for the reduction in the on-resistance.

Furthermore, in these MIS transistors, a silicide layer is preferably formed on the gate electrode and the source and drain impurity regions so that their contact resistances with plugs are reduced. However, the favorable frequency characteristics and on-resistance thereof are not obtained, depending on areas where the silicide layer is formed in each MIS transistor.

SUMMARY

According to an aspect of the present invention, there is provided a semiconductor device including: a substrate; a gate electrode formed above the substrate with a first insulating film therebetween; a second insulating film formed on a sidewall of the gate electrode; a first impurity region of a first conductivity type formed in the substrate, overlapping with an end portion of the gate electrode; a second impurity region of the first conductivity type formed opposite the first impurity region in the substrate; a third impurity region of the first conductivity type formed next to the first impurity region and away from the second insulating film in the substrate, having a higher impurity concentration than the first impurity region; a fourth impurity region of the first conductivity type formed next to the second impurity region in the substrate, having a higher impurity concentration than the second impurity region; and a silicide layer formed above each surface of the gate electrode and the third and fourth impurity regions.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 16A outlining a piece of applicable equipment, FIG. 16B illustrating input and output powers, FIG. 16C illustrating power gain.

DESCRIPTION OF EMBODIMENTS

Hereinafter, embodiments of the present invention will be described in detail with reference to the drawings.

A first embodiment of the present invention is first described.

Figure 1:
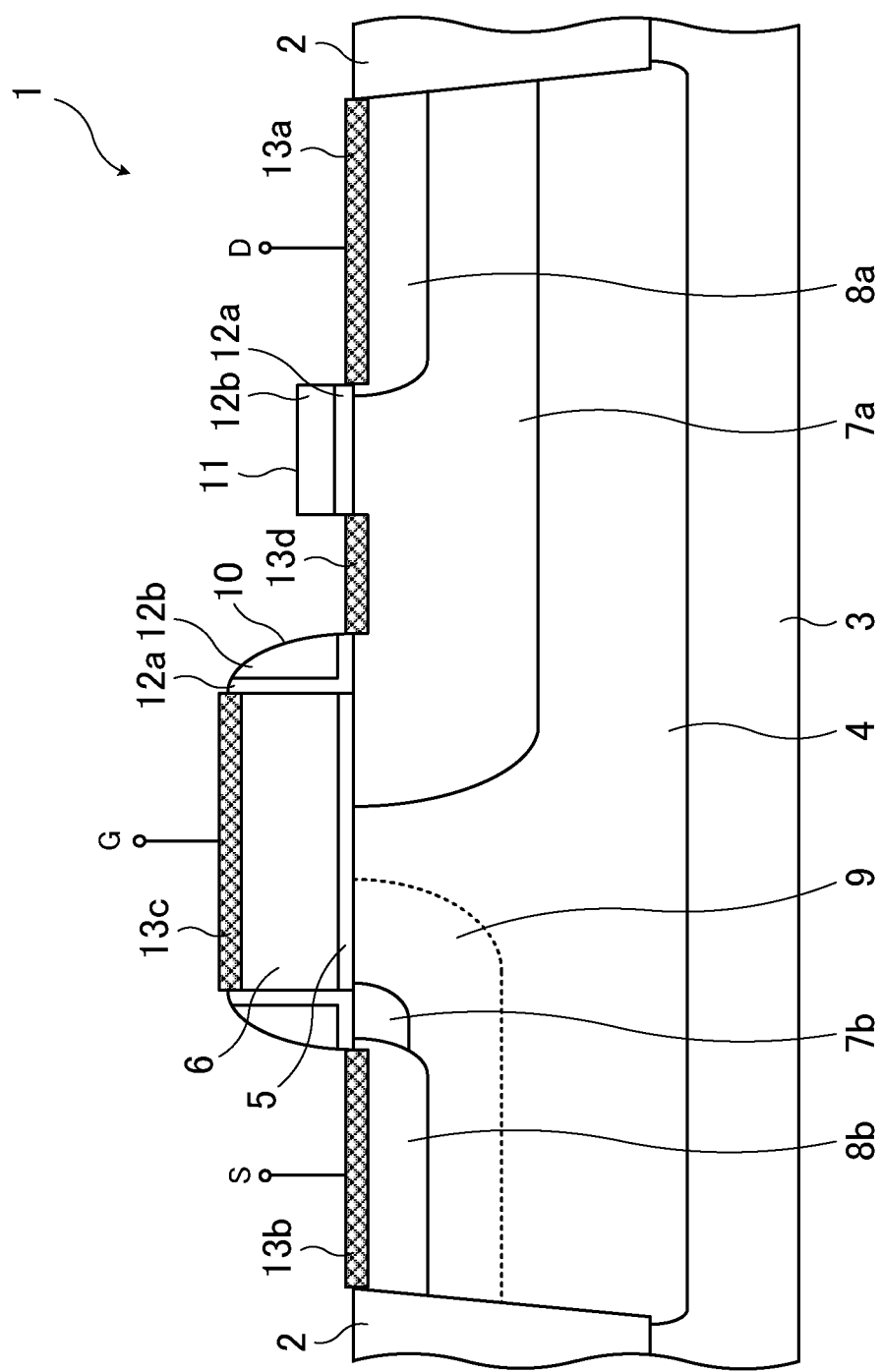
FIG. 1 illustrates an example of the structure of a semiconductor device according to a first embodiment.

FIG. 1 illustrates an example of the structure of a semiconductor device according to the first embodiment.

FIG. 1 exemplifies an n-type MIS transistor 1 according to the first embodiment. The MIS transistor 1 illustrated in FIG. 1 includes a p-type well 4 formed in the element region of a substrate 3, defined by an element isolation region 2. A gate insulating film 5 is formed on the p-type well 4, and a gate electrode 6 is formed on the gate insulating film 5. Across the gate electrode 6, one side serves as a drain, and the other side serves as a source. On the drain side, an n-type low-concentration impurity region 7a and an n-type high-concentration impurity region 8a are formed in predetermined areas. On the source side, an n-type low-concentration impurity region 7b and n-type high-concentration impurity region 8b are formed in predetermined areas.

The low-concentration impurity region 7a on the drain side is deeper than the low-concentration impurity region 7b on the source side. The low-concentration impurity region 7a is formed in a non-self-aligned manner with respect to the gate electrode 6. There is a large overlap between the low-concentration impurity region 7a and the gate electrode 6. The drain-sided high-concentration impurity region 8a is placed with a predetermined offset from the gate electrode 6. The high-concentration impurity region 8a is next to the low-concentration impurity region 7a.

The low-concentration impurity region 7b on the source side is shallower than the low-concentration impurity region 7a on the drain side. The low-concentration impurity region 7b is formed in a self-aligned manner with respect to the gate electrode 6. The high-concentration impurity region 8b on the source side is next to the low-concentration impurity region 7b on the source side.

Within the p-type well 4 of the substrate 3, a channel impurity region 9 including p-type channel impurities for adjusting the threshold voltage of the MIS transistor 1, is formed in an area which surrounds the low-concentration impurity region 7b and the high-concentration impurity region 8b on the source side, the area which reaches the bottom of the gate electrode 6. In the channel impurity region 9, within an area below the gate electrode 6 located between the low-concentration impurity regions 7a and 7b, the concentration of the channel impurities is lower near the drain low-concentration impurity region 7a than near the source low-concentration impurity region 7b.

A sidewall insulating film 10 is formed on a side wall of the gate electrode 6. A silicide block 11 is formed on the drain side of the MIS transistor 1a distance away from the sidewall insulating film 10. In this case, both the sidewall insulating film 10 and the silicide block 11 are formed by layering the first and second insulating films 12a and 12b.

Silicide layers 13a, 13b, and 13c are formed on the surfaces of the drain-sided high-concentration impurity region 8a, the source-sided high-concentration impurity region 8b, and the gate electrode 6, respectively. Not illustrated plugs are connected to the silicide layer 13a, 13b, and 13c respectively so that a predetermined bias is applied to the drain (D), source(S), and gate (G) during operation.

In the MIS transistor 1, a silicide layer 13d is also formed on the surface of the low-concentration impurity region 7a between the sidewall insulating film 10 and the silicide block 11. The silicide layer 13d on the surface of the low-concentration impurity region 7a, and the silicide layer 13a on the surface of the high-concentration impurity region 8a are electrically separated from each other by the silicide block 11.

Thus, in the MIS transistor 1, the drain-sided high-concentration impurity region 8a is placed with a predetermined offset from the gate electrode 6. This enables the MIS transistor 1 to have a higher drain breakdown voltage.

Furthermore, in the MIS transistor 1, the drain-sided low-concentration impurity region 7a and the gate electrode 6 overlap each other. Since the low-concentration impurity region 7a and the gate electrode 6 overlap each other, the parasitic resistance of the overlapping portion is modulated by the bias applied to the gate electrode 6 when the MIS transistor 1 is turned on, thereby decreasing the resistance of the current path. This cancels the increase in the on-resistance caused by placing the high-concentration impurity region 8a with a predetermined offset from the gate electrode 6. Alternatively, the on-resistance is further decreased.

Another structure is known, in which a low-concentration impurity region is formed in a self-aligned manner with respect to the gate electrode 6 instead of the low-concentration impurity region 7a, the low-concentration impurity region including a high-concentration impurity region at an end portion of the low-concentration impurity region closer to the gate electrode 6, the high-concentration impurity region 8a being placed with a predetermined offset from the gate electrode 6. In this structure, the high-concentration impurity region formed at the end portion closer to the gate electrode 6 within the low-concentration impurity region tries to enable the on-resistance to decrease. However, since the high-concentration impurity region is positioned at an end portion closer to the gate electrode 6, when a bias is applied having a value higher than a predetermined value, the drain breakdown voltage is likely to be insufficient. Particularly in the case where either or both of a gate insulating film and a sidewall insulating film are formed with a relatively thin film almost as thick as a film used in an I/O transistor or a core transistor (logic transistor) employed for a logic circuit, such drain breakdown voltage is more likely to be insufficient.

In the MIS transistor 1, the high-concentration impurity region 8a is placed with a predetermined offset from the gate electrode 6, whereas the low-concentration impurity region 7a is formed so as to overlap with the gate electrode 6. This enables the drain breakdown voltage to be sufficient as well as the on-resistance to decrease. For example, in the MIS transistor 1, if the gate insulating film 5 has the same film thickness as in an I/O transistor, even in the case where the gate-source voltage is 0V with the drain-source voltage being about twice as high as an input voltage, a sufficient drain breakdown voltage is obtained.

Furthermore, in the MIS transistor 1, since the silicide layers 13a, 13b, and 13c are formed on the surfaces of the drain-sided high-concentration impurity region 8a, the source-sided high-concentration impurity region 8b, and the gate electrode 6, respectively, the contact resistances thereof with the plugs are reduced.

In the MIS transistor 1, the silicide layer 13d is also formed on the surface of the low-concentration impurity region 7a. The silicide layer 13d is electrically separated from the silicide layer 13a on the surface of the high-concentration impurity region 8a. Therefore, no drain bias is applied to both of the silicide layers 13a and 13d.

If a silicide layer is formed extending from the surface of the high-concentration impurity region 8a to the surface of the low-concentration impurity region 7a, the depletion layer is expanded due to bias application between the silicide layer of the low-concentration impurity region 7a and the substrate 3, thereby increasing the on-resistance. By forming the silicide layers 13a and 13d to be electrically separated from each other, such a phenomenon is prevented.

Furthermore, in the transistor 1, the silicide layer 13c is formed on the whole top surface of the gate electrode 6. Since the silicide layer 13c is thus formed on the whole top surface of the gate electrode 6, compared to the case in which the silicide layer 13c is not formed or partially formed, this structure contributes to the resistance reduction of the gate electrode 6 and the improvement of high frequency characteristics such as the maximum oscillation frequency (fmax).

Moreover, in the MIS transistor 1, within an area below the gate electrode 6 between the low-concentration impurity regions 7a and 7b, the channel impurity concentration is lower on the drain side than on the source side. Since the channel impurity region 9 is formed in such a concentration profile, electric fields are prevented from concentrating on the end portion of the drain, thereby blocking the development of hot carriers so that the lifetime of hot carriers is increased in the MIS transistor 1. Furthermore, compared to the case in which a channel impurity region is formed having a concentration profile almost uniform in source-drain horizontal directions (three substrate planar directions), this structure reduces the on-resistance. Therefore, in addition to the increase in the lifetime of hot carriers, the on-resistance is further reduced.

As has been described, the MIS transistor 1 illustrated in FIG. 1 enables the drain breakdown voltage to be sufficient and the on-resistance to be reduced at the same time. Furthermore, even in the case where either or both of the gate insulating film 5 and the sidewall insulating film 10 are almost as thin as in a logic transistor, this structure enables the drain breakdown voltage to be sufficient and the on-resistance to be reduced. Therefore, when integrated with logic transistors, the MIS transistor 1 can be formed without thickening the gate insulating film of the logic transistor, by sharing the same gate-insulating-film forming process, thereby achieving a high drain breakdown voltage and a low on-resistance at the same time. The MIS transistor 1 has a structure which achieves the integration with a logic transistor with ease at a lower cost.

Next, a method of forming the MIS transistor 1 having the above structure is described with reference to FIGS. 2 to 8 as an example.

Figure 2:
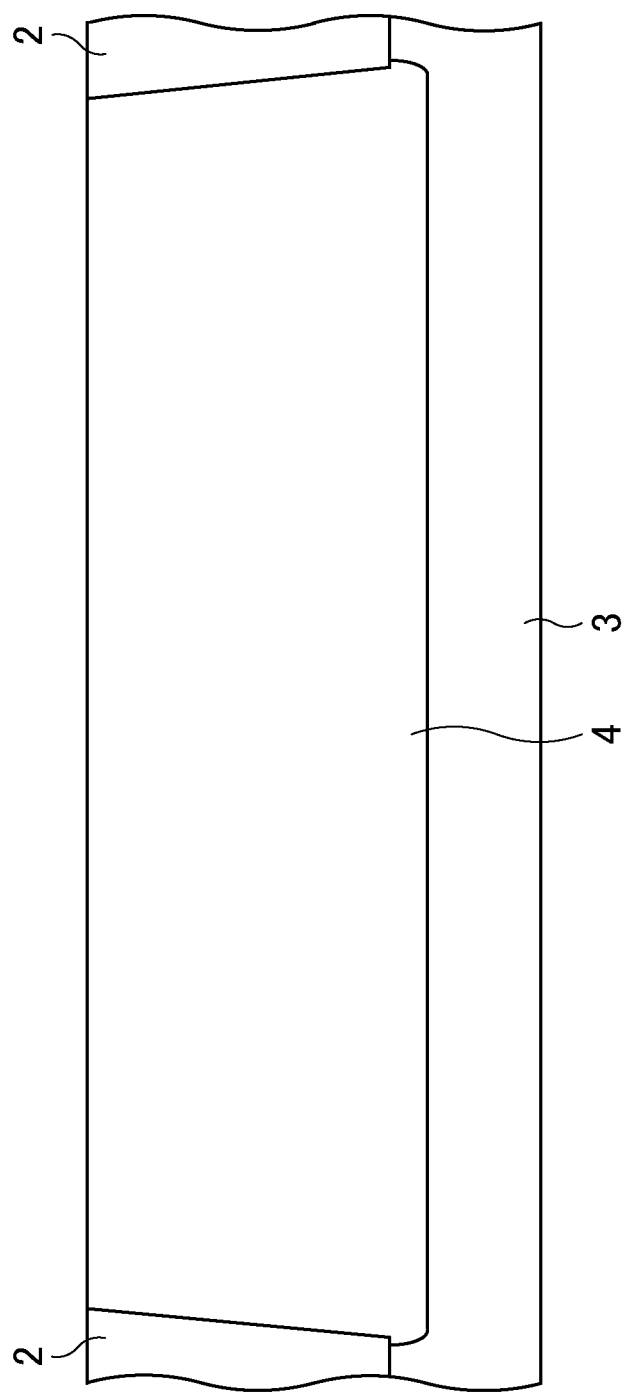
FIG. 2 is a schematic cross-sectional view illustrating a step of forming an element isolation region and a well according to the first embodiment.

FIG. 2 is schematic cross-sectional view illustrating a step of forming an element isolation region and a well according to the first embodiment.

First, on a substrate 3 made of silicon (Si) or the like, an element isolation region 2 is formed by the shallow trench isolation method (STI). Then, p-type impurities are ion-implanted in the element region defined by the element isolation region 2, thereby forming a p-type well 4. For example, the p-type well 4 is formed by ion-implanting boron (B) under the following conditions: acceleration voltage; 200 keV, and dose amount: $1\times10^{13}$ cm$^{-2}$.

Figure 3:
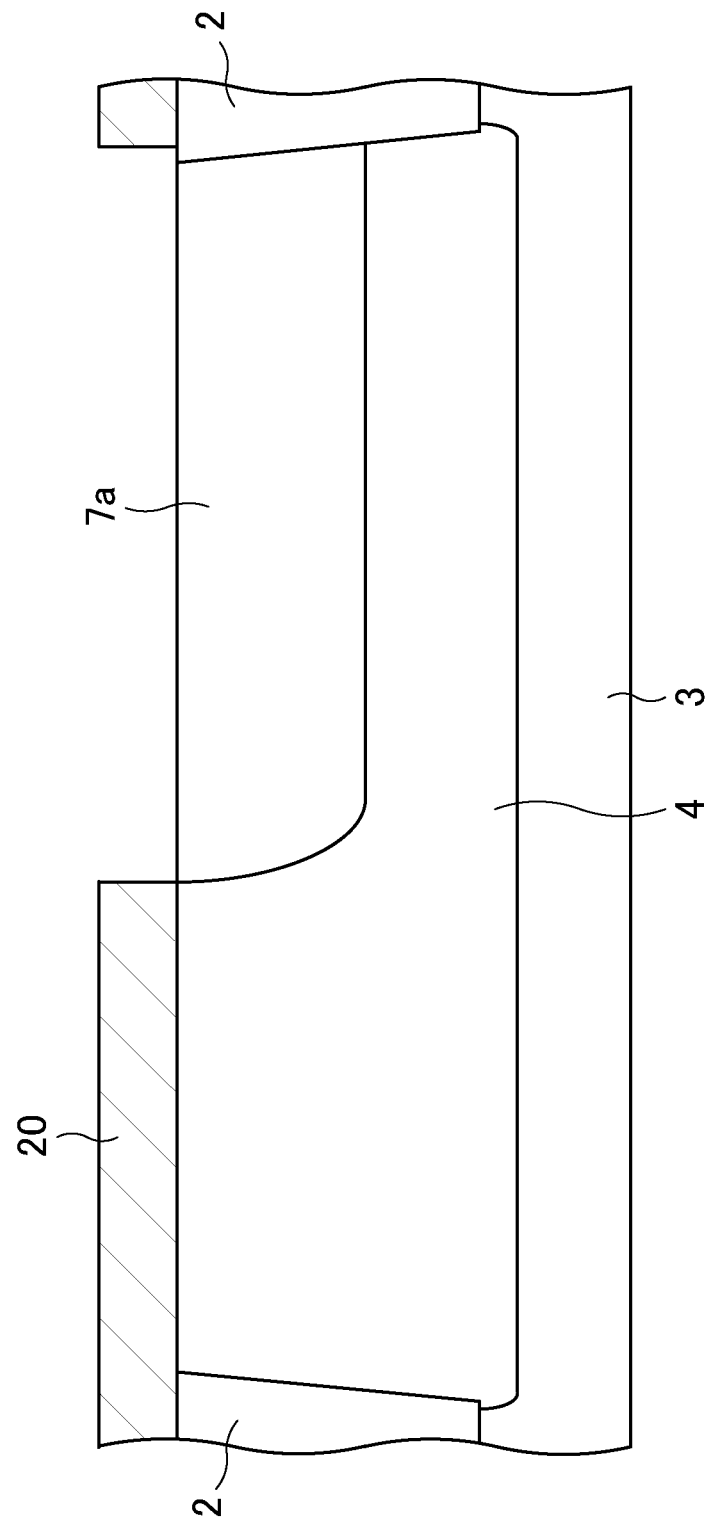
FIG. 3 is a schematic cross-sectional view illustrating a step of forming a drain-sided low-concentration impurity region according to the first embodiment.

FIG. 3 is a schematic cross-sectional view illustrating a step of forming a drain-sided low-concentration impurity region according to the first embodiment.

After the element isolation region 2 and the p-type well 4 are formed, a resist 20 is formed, having an opening through which a drain-sided low-concentration impurity region 7a is formed. Using the resist 20 as a mask, n-type impurities are ion-implanted, thereby forming the low-concentration impurity region 7a to serve as an LDD region. The impurity concentration of the low-concentration impurity region 7a is preferably $1\times10^{17}$ cm$^{-3}$ to $1\times10^{18}$ cm$^{-3}$. The low-concentration impurity region 7a is formed, for example, by ion-implanting phosphorus (P) under the following conditions: acceleration voltage: 200 keV, and dose amount: $1\times10^{13}$ cm$^{-2}$. In addition to phosphorus, arsenic (As), antimony (Sb), and the like are used as n-type impurities.

After the low-concentration impurity region 7a is formed, the resist 20 is removed, followed by annealing, for example, at 1000° C. for ten seconds to diffuse the ion-implanted impurities.

Figure 4:
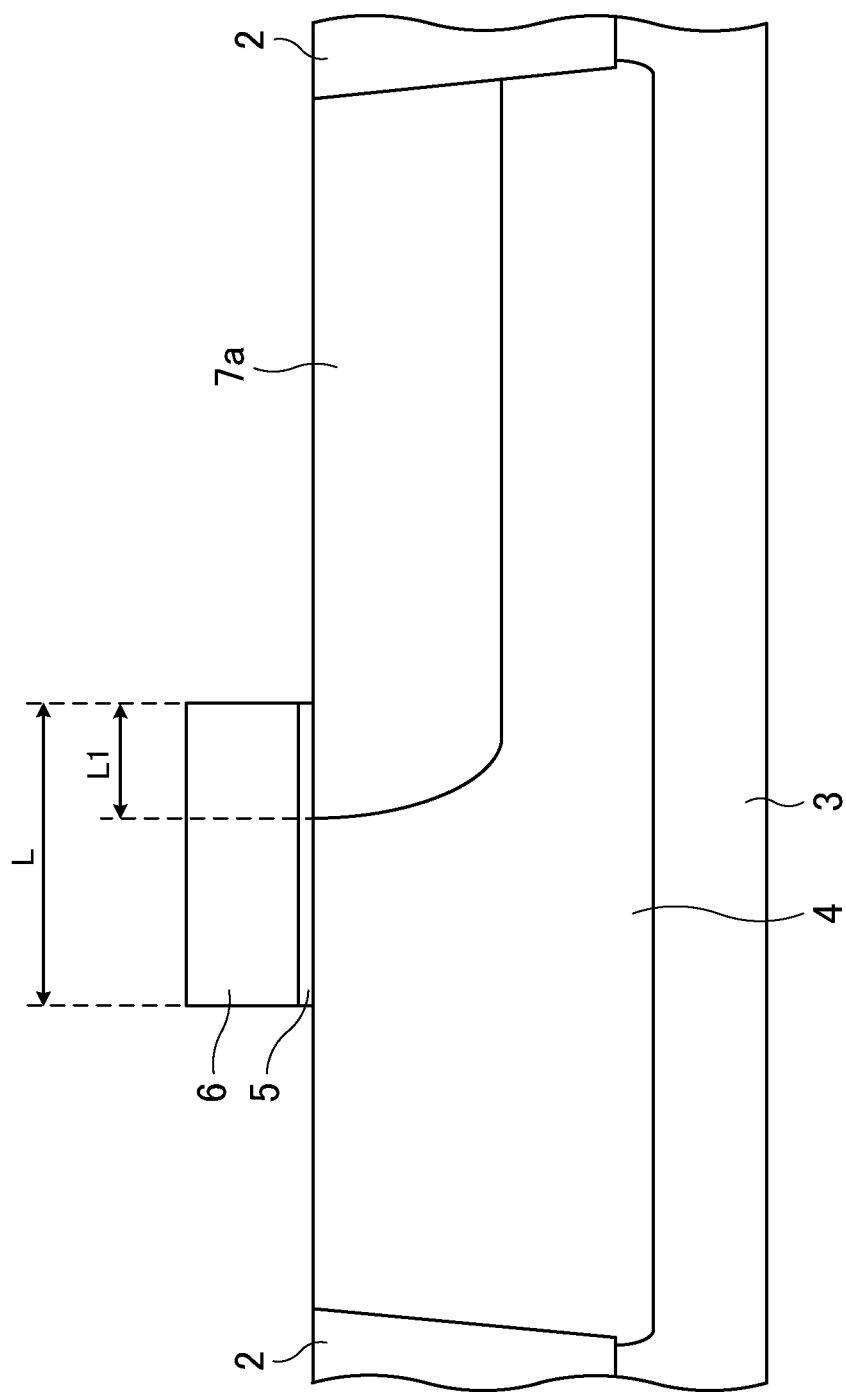
FIG. 4 is a schematic cross-sectional view illustrating a step of forming a gate insulating film and a gate-electrode according to the first embodiment.

FIG. 4 is a schematic cross-sectional view illustrating a step of forming a gate insulating film and a gate electrode according to the first embodiment.

After annealing, for example, a thermal-oxide film having a thickness of about 7 nm is formed on the surface of the substrate 3 by the thermal oxidation method. Then, for example, polysilicon is deposited on the thermal-oxide film by the chemical vapor deposition (CVD) with a thickness of 100 nm. After that, a resist having an opening through which a gate electrode 6 is formed (not illustrated) is formed, followed by dry etching for work on the polysilicon and the thermal-oxide film, thereby forming the gate electrode 6 and the gate insulating film 5.

In this case, there is an overlap of a predetermined length L1 between the gate electrode 6 and the gate insulating film 5, and one end portion of the low-concentration impurity region 7a. For example, in the case where a gate length L is 500 nm, the overlap length L1 is roughly in the range from 100 nm to 300 nm. If the overlap length L1 is shorter than 100 nm, the satisfactory reduction of on-resistance is not possibly obtained, depending on the position where a high-concentration impurity region 8a is to be formed in a later step. On the other hand, if the overlap length L1 is longer than 300 nm, the distance between the end portion of the low-concentration impurity region 7a and a source-sided low-concentration impurity region 7b to be formed later is likely to beyond a predetermined value range.

The overlap length L1 is set as appropriate depending on the gate length L, other structures, and needed properties of the MIS transistor 1 to be formed.

Figure 5:
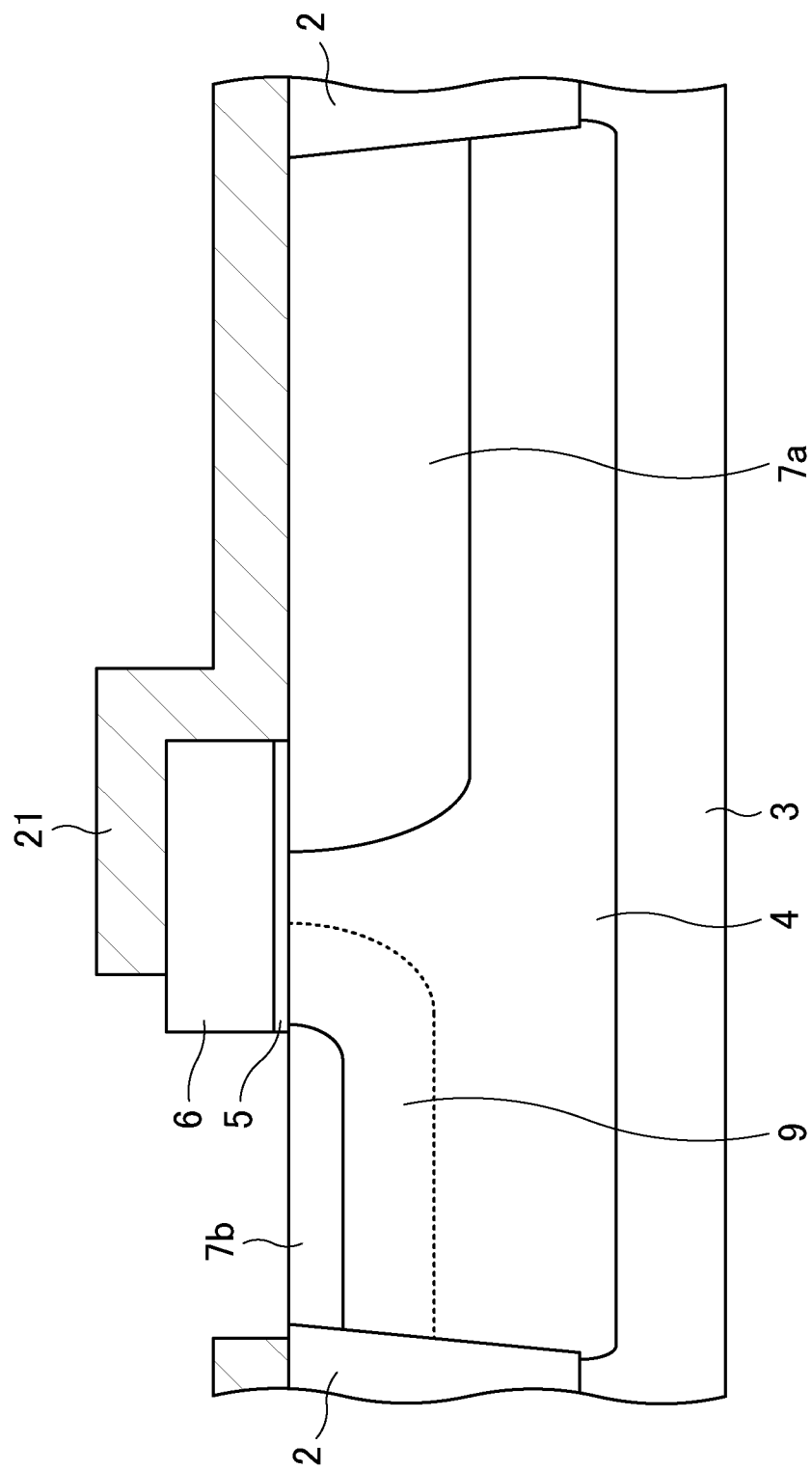
FIG. 5 is a schematic cross-sectional view illustrating a step of forming a channel impurity region and a source-sided low-concentration impurity region according to the first embodiment.

FIG. 5 is a schematic cross-sectional view illustrating a step of forming a channel impurity region and a source-sided low-concentration impurity region according to the first embodiment.

After the gate electrode 6 and the gate insulating film 5 are formed, a resist 21 is formed, having an opening through which a channel impurity region 9 is formed. Then, p-type impurities as channel impurities are ion-implanted at a predetermined angle relative to the surface of the substrate 3 (for example, 45-degree angle) to form the channel impurity region 9. The channel impurity region 9 is formed, for example, by ion-implanting boron under the following conditions: acceleration voltage: 30 keV, and dose amount: $5\times10^{12}$ cm$^{-2}$.

Next, using the resist 21 as a mask in a similar manner, n-type impurities are ion-implanted on the surface of the substrate 3 in a normal direction, thereby forming the low-concentration impurity region 7b in a self-aligned manner to serve as a source-sided extension region. The low-concentration impurity region 7b is formed, for example, by ion-implanting phosphorus under the following conditions: acceleration voltage 30 keV, and dose amount: $1\times10^{12}$ cm$^{-2}$.

Figure 6:
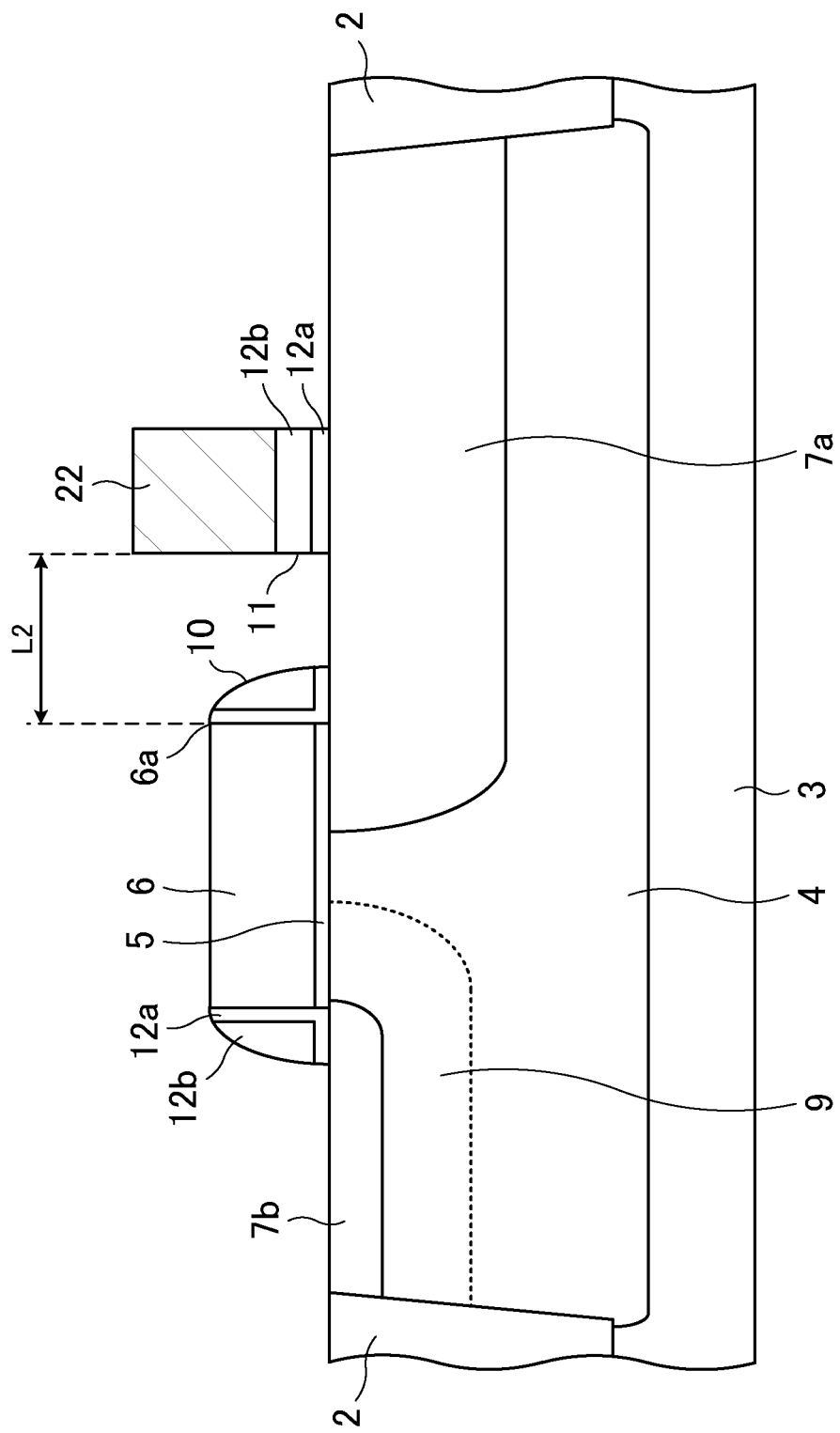
FIG. 6 is a schematic cross-sectional view illustrating a step of forming a sidewall insulating film and a silicide block according to the first embodiment.

FIG. 6 is a schematic cross-sectional view illustrating a step of forming a sidewall insulating film and a silicide block according to the first embodiment.

After the channel impurity region 9 and the low-concentration impurity region 7b are formed, a silicon oxide (SiO) film and a silicon nitride (SiN) film are formed in layers in this order by the CVD method on the whole surface of the substrate 3 as first and second insulating films 12a and 12b. In this case, for example, the silicon oxide film has a thickness of 10 nm, and the silicon nitride film has a thickness of 30 nm.

Next, on the formed silicon oxide and silicon nitride films, a resist 22 is formed to cover the area on which the silicide block 11 is formed. In this case, the resist 22 is formed a distance L2 away from the drain-sided edge 6a of the gate electrode 6, longer than the position tolerance. The position tolerance means the amount of the photomask deviation from the gate electrode 6, which occurs in a photo lithography process of forming the resist 22. Then using the resist 22 as a mask for dry etching, the sidewall insulating film 10 is formed on the sidewall of the gate electrode 6, as well as the silicide block 11 is formed.

Figure 8:
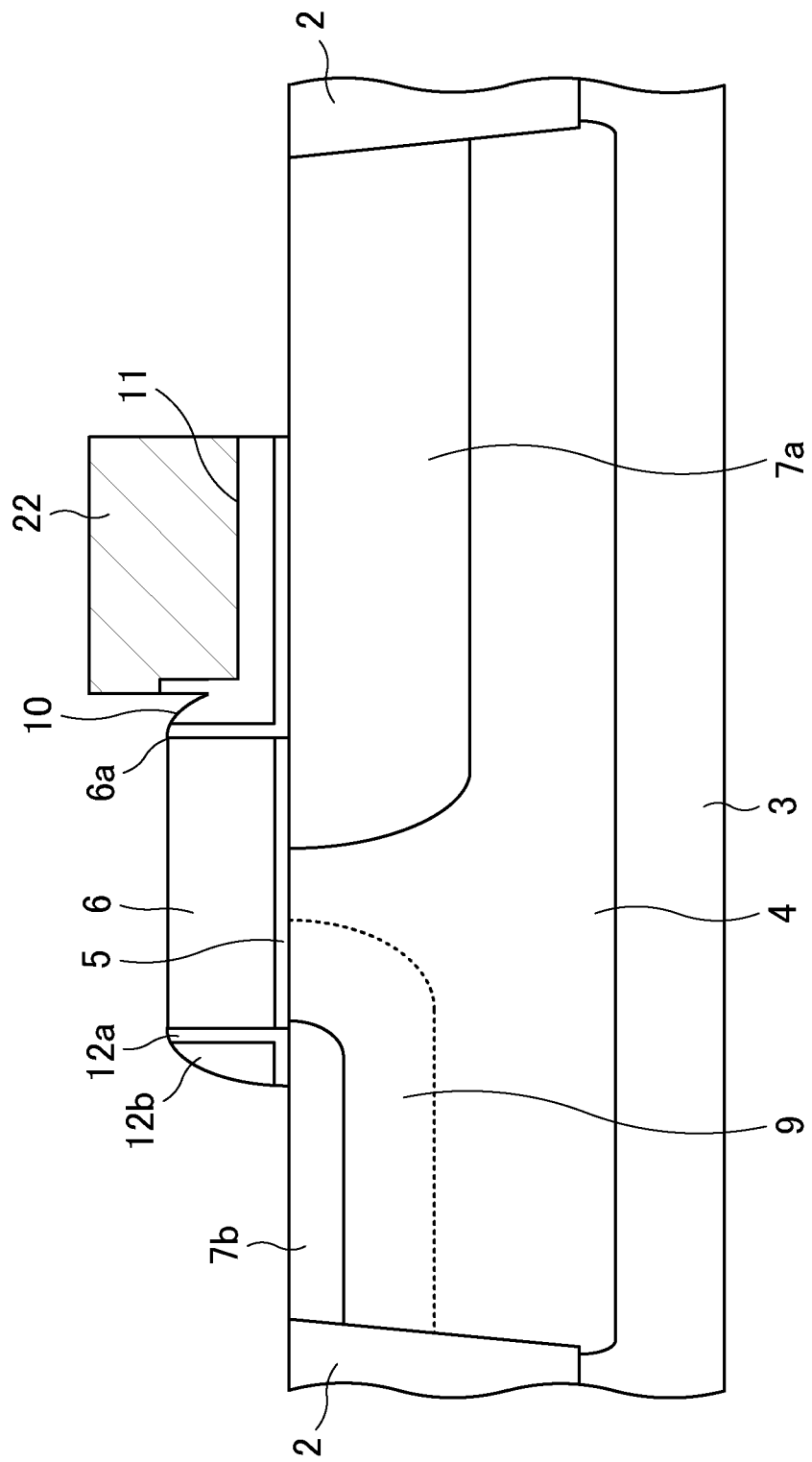
FIG. 8 is a schematic cross-sectional view illustrating another step of forming a sidewall insulating film and a silicide block.

In FIG. 6, the sidewall insulating film 10 and the silicide block 11 are separated from each other. However, the sidewall insulating film 10 and the silicide block 11 may be formed integrally. Details of this variation will be described later (FIG. 8).

Figure 7:
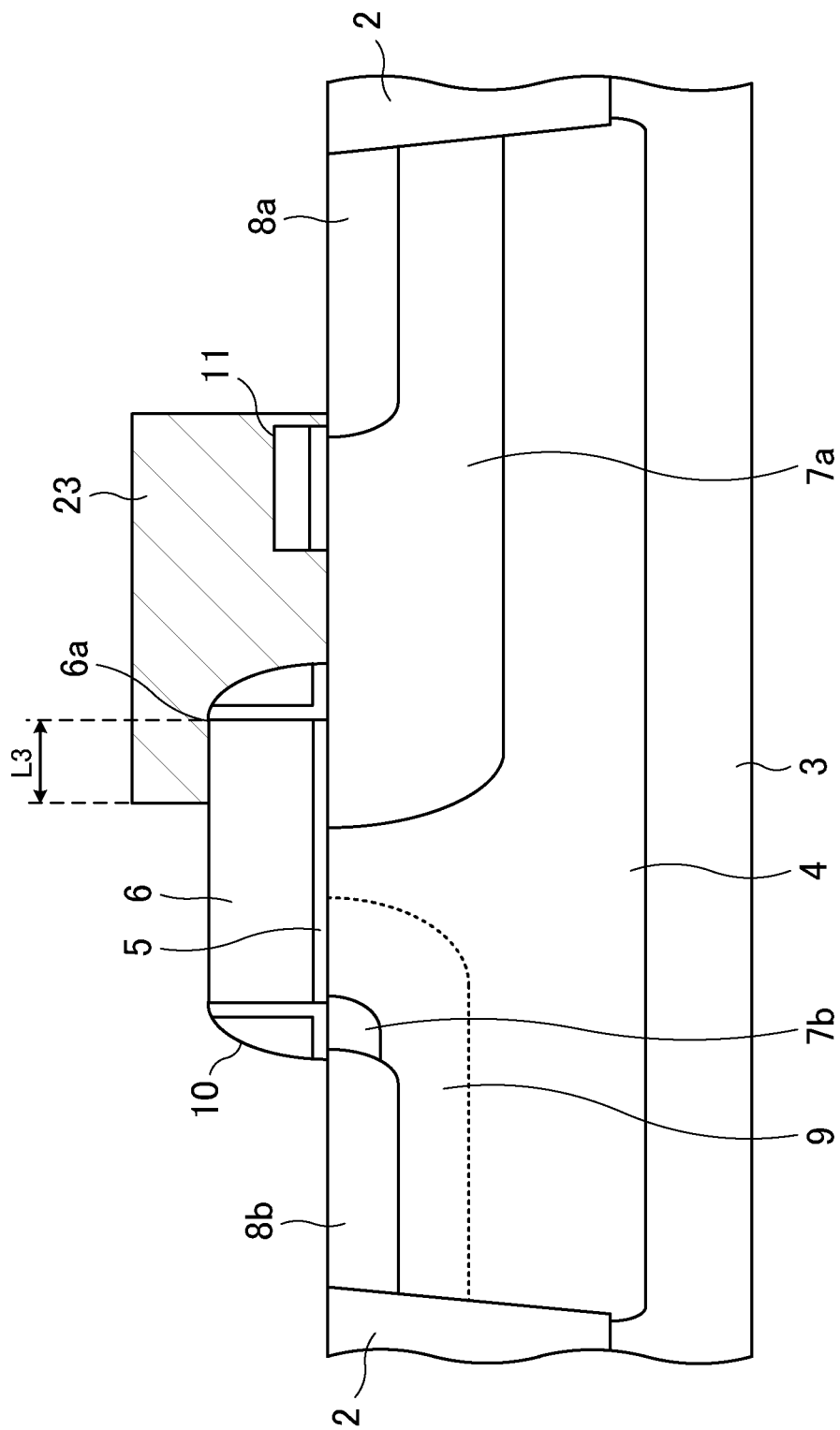
FIG. 7 is a schematic cross-sectional view illustrating a step of forming drain-sided and source-sided high-concentration impurity regions according to the first embodiment.

FIG. 7 is a schematic cross-sectional view illustrating a step of forming drain-sided and source-sided high-concentration impurity regions according to the first embodiment.

After the sidewall insulating film 10 and the silicide block 11 are formed, a resist 23 is formed to cover the offset between the high-concentration impurity region 8a and the gate electrode 6. Then using the resist 23 as a mask, n-type impurities are ion-implanted to form the high-concentration impurity regions 8a and 8b, on the drain side and the source side, respectively. At the same time, n-type impurities are ion-implanted also on the gate electrode 6. The high-concentration impurity regions 8a and 8b are formed, for example, by ion-implanting phosphorus under the following conditions: acceleration voltage: 10 keV, and dose amount: $5\times10^{15}$ cm$^{-2}$.

After that, the resist 23 is removed, followed by annealing at 1000° C. for one second to activate the ion-implanted impurities.

The drain-sided high-concentration impurity region 8a is thus formed by using the resist 23 in the substrate 3 with a predetermined offset from the drain-sided edge 6a of the gate electrode 6. On the other hand, the source-sided high-concentration impurity region 8b is formed by using the gate electrode 6 and the sidewall insulating film 10 as masks in a self-aligned manner outside the low-concentration impurity region 7b in the substrate 3.

The resist 23 covers at least the low-concentration impurity region 7a, which appears between the drain-sided sidewall insulating film 10 and the silicide block 11. However, as illustrated in FIG. 7, in addition to the area between the sidewall insulating film 10 and the silicide block 11, the resist 23 may partially cover the sidewall insulating film 10, the silicide block 11, and the gate electrode 6. This structure allows the area between the sidewall insulating film 10 and the silicide block 11 to be covered with the resist 23 without failure even in the case where a position gap occurs in the photo lithography process of forming the resist 23. As a result, the structure prevents the high-concentration impurity region from being formed on the area between the sidewall insulating film 10 and the silicide block 11 without failure.

The resist 23 covers the gate electrode 6 by a length L3. The length L3 is preferably shorter than the diffusion length of the impurities ion-implanted on the gate electrode 6, caused by annealing to be performed later. For example, the length L3 may be about 50 nm. Specifically, the length L3 is shorter than the length which sufficiently allows the impurities ion-implanted on the portion of the gate electrode 6 not covered with the resist 23, to be diffused into the portion of the gate electrode 6 covered with the resist 23, due to annealing to be performed later. This allows the ion-implanted impurities to be diffused into the whole gate electrode 6, thereby making it possible to decrease the resistance of the gate electrode 6.

If impurities are implanted in a portion of the gate electrode 6, the impurities are supposed so as to diffuse into the whole gate electrode 6 by annealing. In this case, as impurities to be ion-implanted on the gate electrode 6, phosphorus, which has a relatively large diffusion constant, is preferably employed. Also in this case, according to the above procedure, the drain-sided and source-sided high-concentration impurity regions 8a and 8b are also formed with phosphorus.

In FIG. 7, the resist 23 covers the whole silicide block 11. However, the resist 23 may partially cover the silicide block 11. Specifically, as long as the resist 23 covers the area between the silicide block 11 and the sidewall insulating film 10, so as not to form a high-concentration impurity region in the area, the resist 23 is not limited to the position illustrated in FIG. 7.

After the high-concentration impurity regions 8a and 8b are formed with the resist 23 on the drain side and the source side respectively as illustrated in FIG. 7, silicidation is performed using a metal such as nickel (Ni) or cobalt (Co). Specifically, after depositing a predetermined metal, annealing is performed to react the metal with silicon, so that an unreacted portion of the metal is removed. Silicide layers 13a, 13b, 13c, and 13d are thus formed on the surfaces of the high-concentration impurity regions 8a and 8b, the gate electrode 6, and the low-concentration impurity region 7a, respectively, thereby forming the MIS transistor 1 illustrated in FIG. 1. Since the silicide block 11 is formed, the drain-sided silicide layers 13a and 13d are electrically separated from each other without failure.

In the forming step of the sidewall insulating film 10 and the silicide block 11 illustrated in FIG. 6, after forming the first and second insulating films 12a and 12b, the resist 22 is formed the distance L2 away from the drain-sided edge 6a of the gate electrode 6, longer than the position tolerance. In this case, the resist 22 is formed as illustrated in FIG. 6, or alternatively as illustrated in FIG. 8.

FIG. 8 is a schematic cross-sectional view illustrating another step of forming a sidewall insulating film and a silicide block.

In the example illustrated in FIG. 8, a resist 22 is formed on the portion where the silicide block 11 is to be formed, extending to near the edge 6a of the gate electrode 6. Etching is performed with the resist 22 as a mask so that a sidewall insulating film 10 and the silicide block 11 are formed integrally on the drain side. After forming the sidewall insulating film 10 and the silicide block 11 integrally, the step illustrated in FIG. 7 and then silicidation are performed.

With the method illustrated in FIG. 8, in the step of FIG. 7 to be performed, ion-implantation is performed in the MIS transistor 1 without forming the resist 23. Specifically, without using the resist 23, and without forming any high-concentration impurity region within the low-concentration impurity region 7a, ion-implantation is performed to form the high-concentration impurity regions 8a and 8b, and performed on the gate electrode 6. After that, silicide layers 13a, 13b, and 13c are formed on the surfaces of the high-concentration impurity regions 8a and 8b, and the entire surface of the gate electrode 6, respectively.

In this way, the resist 22 may be formed on the portion where the silicide block 11 is to be formed, extending to near the edge 6a of the gate electrode 6.

However, the resist 22 preferably avoids extending above the gate electrode 6. Otherwise, the first and second insulating films 12a and 12b, which have been formed on the top surface of the gate electrode 6, are protected from etching by the resist 22. The first and second insulating films 12a and 12b then remain on the top surface of the gate electrode 6. In this case, if silicidation is performed after the ion-implantation for forming the high-concentration impurity regions 8a and 8b as well as the ion-implantation on the gate electrode 6, a silicide layer 13c is formed partially on the surface of the gate electrode 6. Therefore, the resistance reduction of the gate electrode 6 and the improvement of high frequency characteristics are interfered with.

Therefore, when a resist 22 is formed after forming the channel impurity region 9 and the low-concentration impurity region 7b as illustrated in FIG. 5, the resist 22 is preferably formed closer to the drain side, rather than the edge 6a of the gate electrode 6.

In the method described above, the n-type MIS transistor 1 illustrated in FIG. 1 is obtained, which achieves a high drain breakdown voltage and a low on-resistance at the same time.

Next, a second embodiment of the present invention is described.

Figure 9:
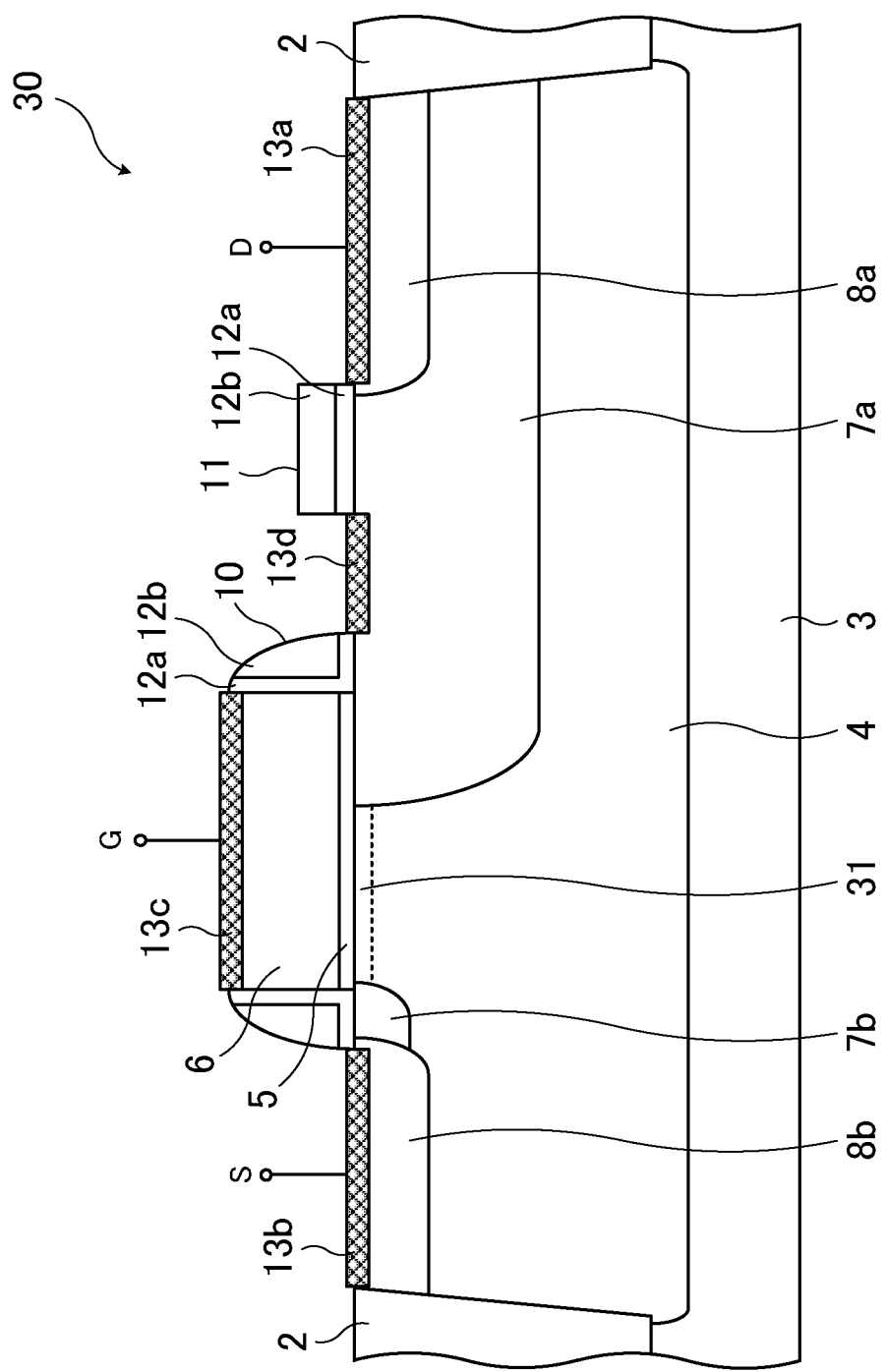
FIG. 9 illustrates an example of the structure of a semiconductor device according to a second embodiment.

FIG. 9 illustrates an example of the structure of a semiconductor device according to the second embodiment.

FIG. 9 exemplifies an n-type MIS transistor 30 according to the second embodiment. The MIS transistor 30 illustrated in FIG. 9 is different from the MIS transistor 1 according to the first embodiment, in that the MIS transistor 30 includes a channel impurity region 31 having a concentration profile almost uniform in a source-drain horizontal direction.

The channel impurity region 31 is formed by ion-implantation in a commonly-used normal direction relative to the substrate 3, as will be described later. Therefore, the threshold voltage and the drain breakdown voltage of the MIS transistor 30 are controlled with ease, compared to the case where ion-implantation is performed in a slanting direction. Therefore, the performance variations among different MIS transistors 30 are prevented. As a result, MIS transistors 30 which have fewer performance variations are manufactured in a simplified process at low cost with a higher yield rate.

A method of forming the MIS transistor 30 is described with reference to FIGS. 10 to 15 in order as an example. An element isolation region 2 and a p-type well 4 are formed in the same procedure as in the first embodiment (FIG. 2), so only the subsequent steps are described here.

Figure 10:
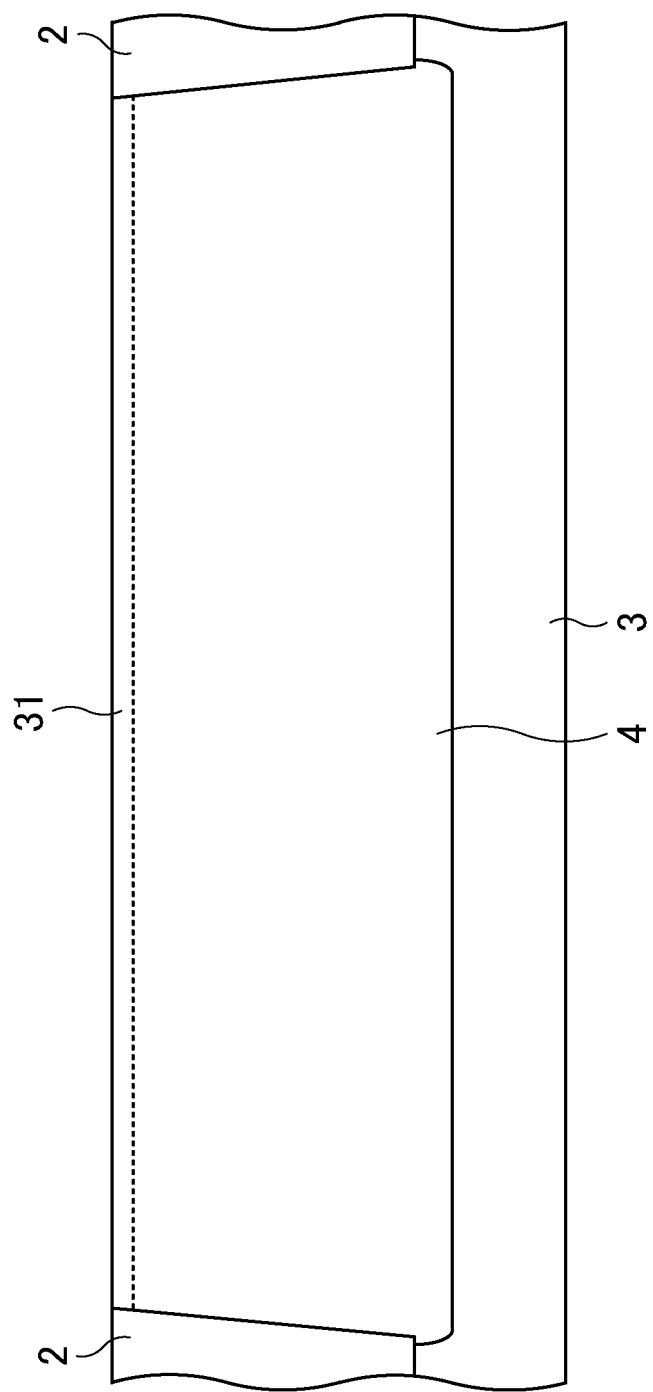
FIG. 10 is a schematic cross-sectional view illustrating a channel-ion-implanting step according to the second embodiment.

FIG. 10 is a schematic cross-sectional view illustrating a channel-ion-implanting according to the second embodiment.

After the element isolation region 2 and the p-type well 4 are formed as illustrated in FIG. 2, p-type impurities as channel impurities are ion-implanted into the surface of the substrate 3 in a normal direction as illustrated in FIG. 10, thereby forming a channel impurity region 31. The channel impurity region 31 is formed, for example, by ion-implanting boron under the following conditions: acceleration voltage: 30 keV, and dose amount: $5 \times 10^{12}$ cm$^{-2}$.

Figure 11:
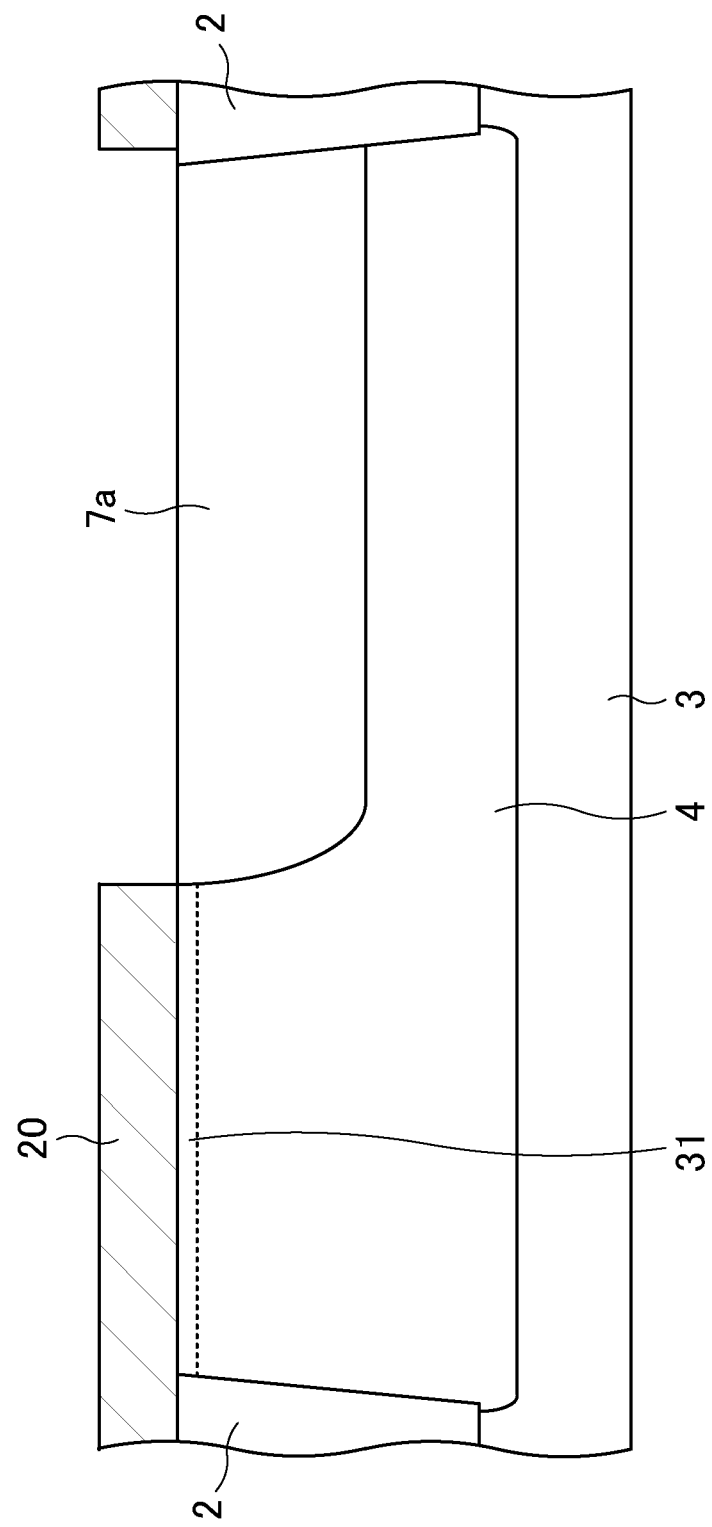
FIG. 11 is a schematic cross-sectional view illustrating a step of forming a drain-sided low-concentration impurity region according to the second embodiment.

FIG. 11 is a schematic cross-sectional view illustrating a step of forming a drain-sided low-concentration impurity region according to the second embodiment.

After the channel impurity region 31 is formed, a resist 20 is formed, having an opening through which a drain-sided low-concentration impurity region 7a is formed. Using the resist 20 as a mask, n-type impurities are ion-implanted, thereby forming the low-concentration impurity region 7a. After the low-concentration impurity region 7a is formed, the resist 20 is removed, followed by annealing, for example, at 1000° C. for ten seconds.

Figure 12:
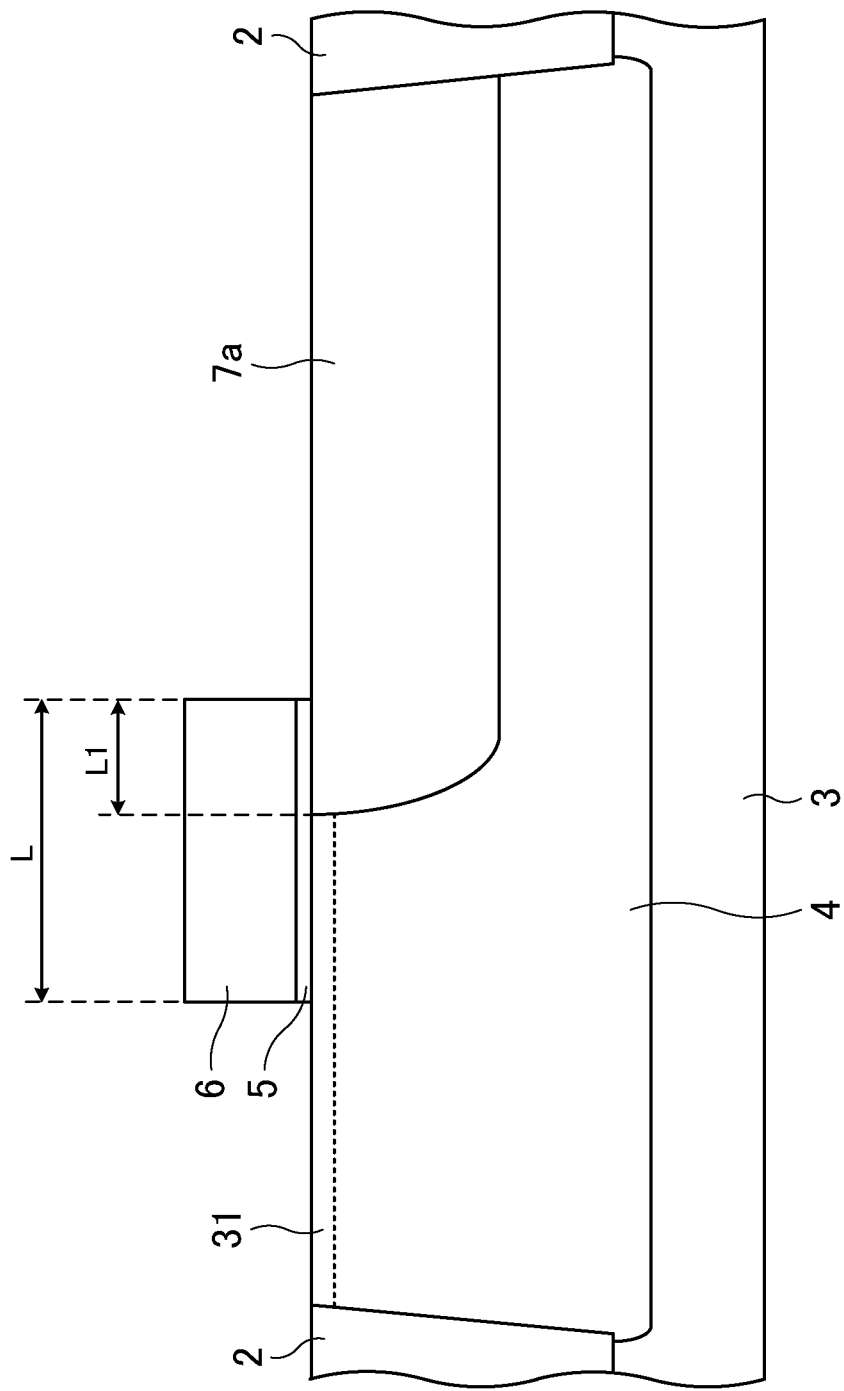
FIG. 12 is a schematic cross-sectional view illustrating a step of forming a gate insulating film and a gate-electrode according to the second embodiment.

FIG. 12 is a schematic cross-sectional view illustrating a step of forming a gate insulating film and a gate-electrode according to the second embodiment.

After annealing, a thermal-oxide film is formed, and polysilicon is deposited thereon. The polysilicon-deposited thermal-oxide film is then dry-etched to form a gate electrode 6 and a gate insulating film 5. There is an overlap of a predetermined length L1 between the gate electrode 6 and the gate insulating film 5, and the end portion of the low-concentration impurity region 7a.

Figure 13:
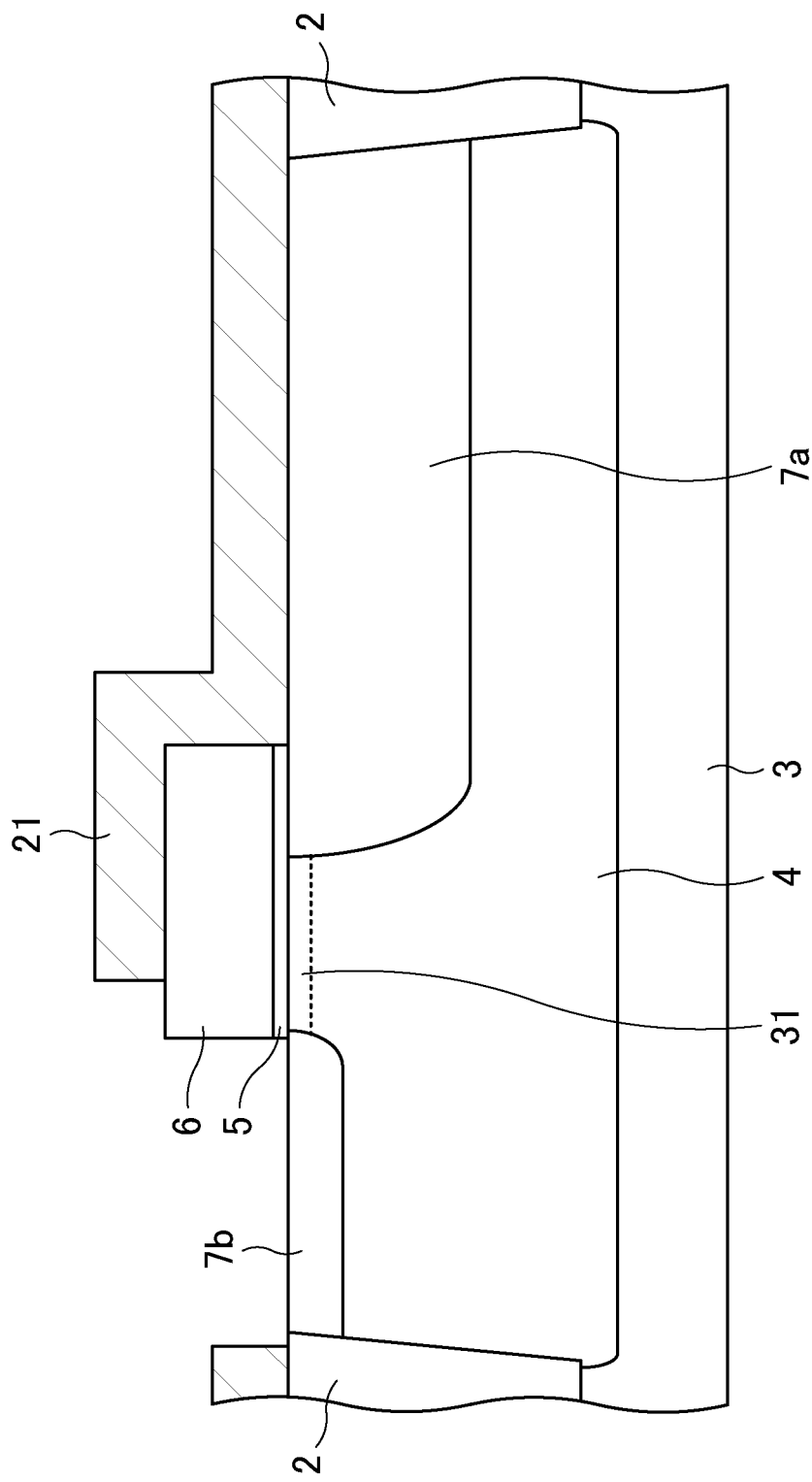
FIG. 13 is a schematic cross-sectional view illustrating a step of forming a source-sided low-concentration impurity region according to the second embodiment.

FIG. 13 is a schematic cross-sectional view illustrating a step of forming a source-sided low-concentration impurity region according to the second embodiment.

After the gate electrode 6 and the gate insulating film 5 are formed, a resist 21 is formed, having an opening on the source side. Using the resist 21 with a mask, n-type impurities are ion-implanted to form a source-sided low-concentration impurity region 7b.

Figure 14:
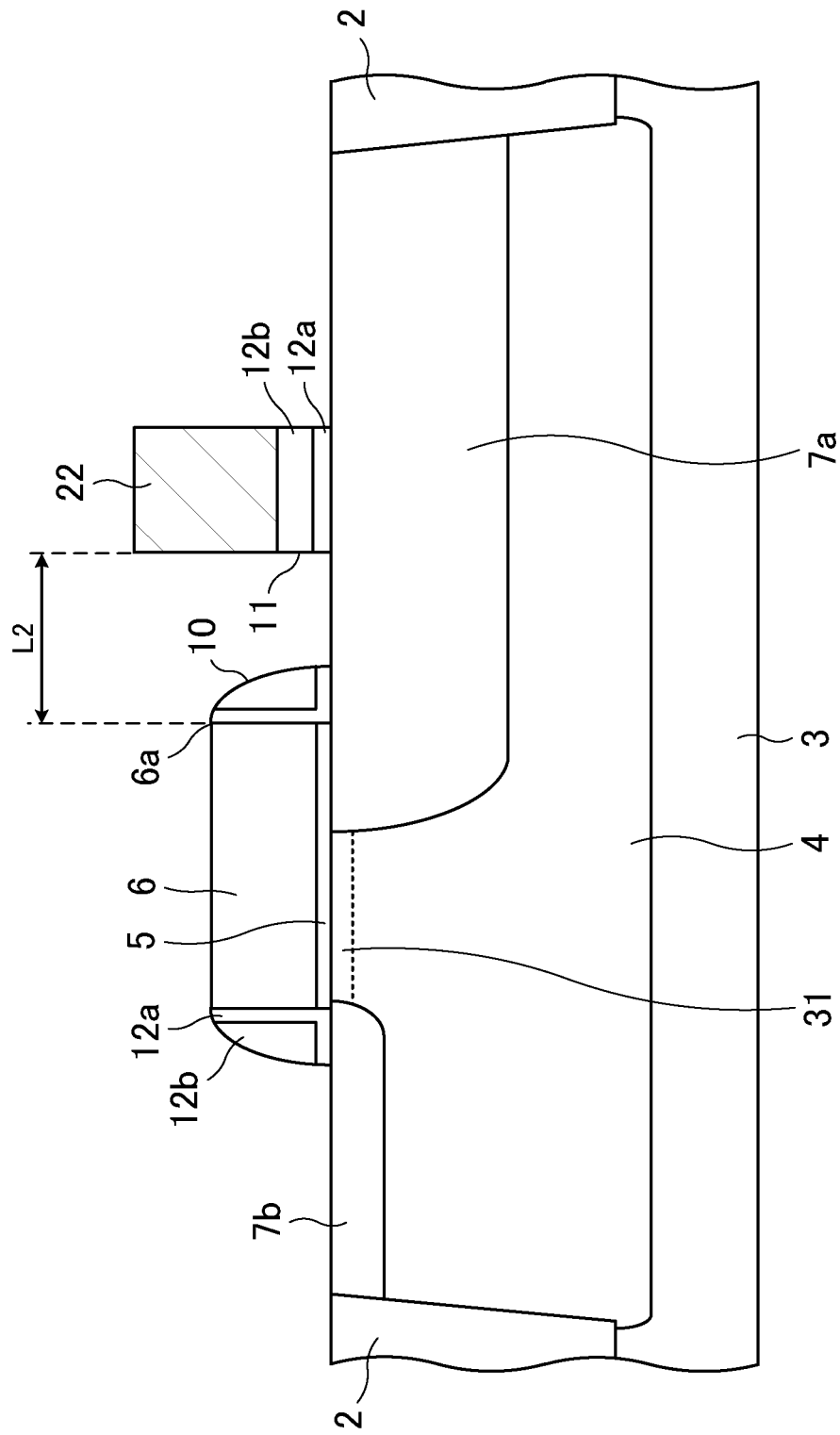
FIG. 14 is a schematic cross-sectional view illustrating a step of forming a sidewall insulating film and a silicide block according to the second embodiment.

FIG. 14 is a schematic cross-sectional view illustrating a step of forming a sidewall insulating film and a silicide block according to the second embodiment.

After the low-concentration impurity region 7b is formed, first and second insulating films 12a and 12b are formed in layers on the whole surface of the substrate 3, and a resist 22 is formed to cover the area on which the silicide block 11 is formed. The resist 22 is formed, for example, a distance L2 away from the drain-sided edge 6a of the gate electrode 6, longer than the position tolerance. Then using the resist 22 as a mask for dry etching, the sidewall insulating film 10 is formed on the sidewall of the gate electrode 6, as well as the silicide block 11 is formed.

Figure 15:
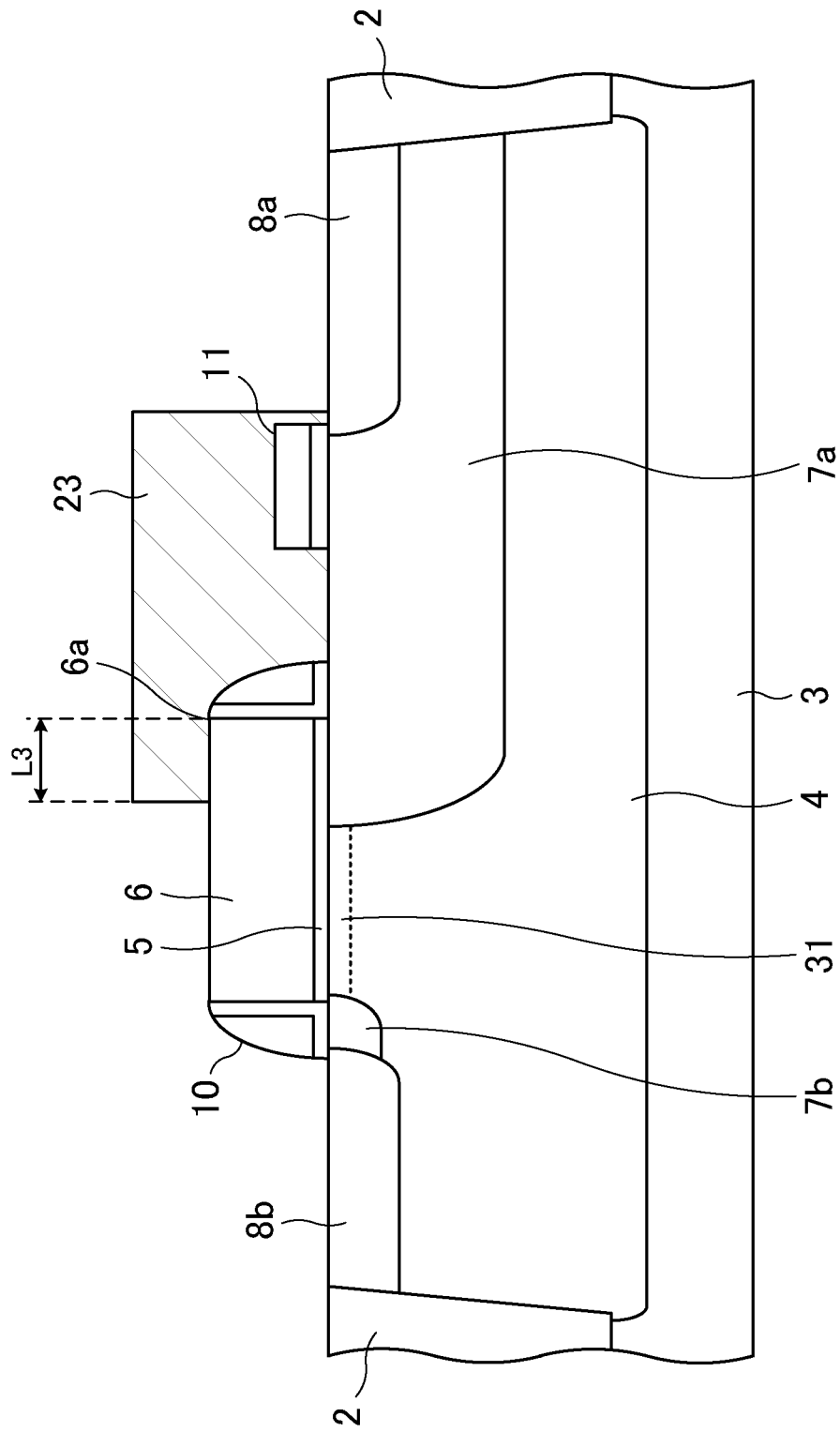
FIG. 15 is a schematic cross-sectional view illustrating a step of forming drain-sided and source-sided high-concentration impurity regions according to the second embodiment.

FIG. 15 is a schematic cross-sectional view illustrating a step of forming drain-sided and source-sided high-concentration impurity regions according to the second embodiment.

After the sidewall insulating film 10 and the silicide block 11 are formed, a resist 23 is formed to cover the offset between the high-concentration impurity region 8a and the gate electrode 6. In the case where the resist 23 is formed on the gate electrode 6 at the same time, the length L3 is, for example, shorter than the diffusion length of the impurities ion-implanted on the gate electrode 6 caused by annealing to be performed later.

Then using the resist 23 as a mask, n-type impurities are ion-implanted to form the drain-sided and source-sided high-concentration impurity regions 8a and 8b, as well as n-type impurities are ion-implanted on the gate electrode 6 at the same time. After that, the resist 23 is removed, followed by annealing at 1000° C. for one second.

After forming the high-concentration impurity regions 8a and 8b, silicidation is performed to form silicide layers 13a, 13b, 13c, and 13d on the surfaces of the high-concentration impurity regions 8a and 8b, the gate electrode 6 and the low-concentration impurity region 7a, respectively. The MIS transistor 30 illustrated in FIG. 9 is thus obtained.

The resist 22 used for forming the sidewall insulating film 10 and the silicide block 11 illustrated in FIG. 14 may be formed on the portion where the silicide block 11 is to be formed, extending to near the edge 6a of the gate electrode 6 as in FIG. 8. This can prevent a high-concentration impurity region from forming in the low-concentration impurity region 7a without using the resist 23 without failure in a step of FIG. 15 to be taken, the same as in FIG. 8. After that, silicide layers 13a, 13b, and 13c are formed on the surfaces of the high-concentration impurity regions 8a and 8b, and the entire surface of the gate electrode 6, respectively.

The foregoing description relates to the MIS transistors 1 and 30. Applications of the MIS transistors 1 and 30 are exemplified here.

Figure 16A:
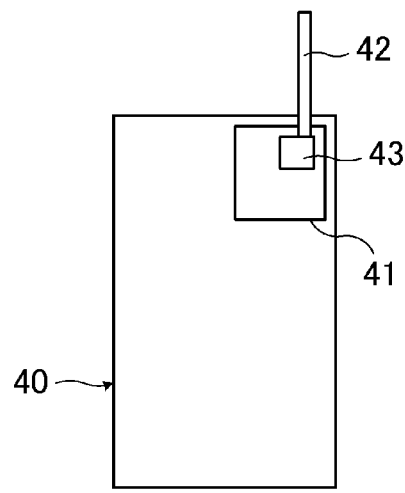
FIGS. 16A to 16C illustrate applications of an MIS transistor.
Figure 16B:
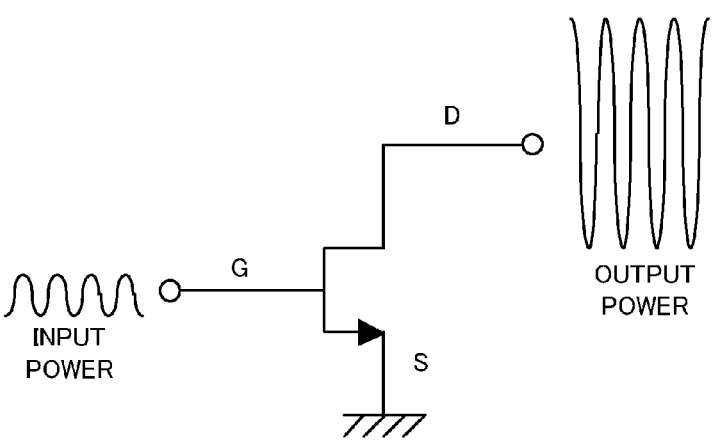
Figure 16C:
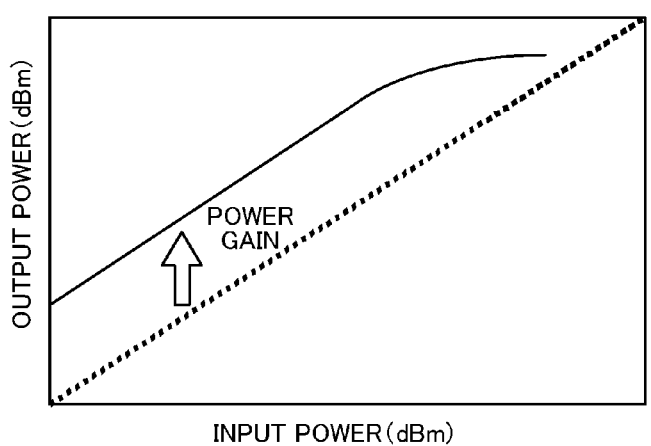

FIGS. 16A to 16C illustrate applications of an MIS transistor; FIG. 16A outlining a piece of applicable equipment, FIG. 16B illustrating input and output powers, FIG. 16C illustrating power gain.

As illustrated in FIG. 16A, a mobile terminal 40 for wireless communications includes a transmission module 41 having an antenna 42 and a transistor (power amplifier) 43 for power amplification. The power amplifier 43, in most cases, delivers output power about twice as much as the power delivered at the bias point, relative to input RF power as illustrated in FIG. 16B, to obtain a power gain. The power amplifier 43 has a gate voltage almost as high as that of the I/O transistor included in the control circuit, but also has a drain voltage about twice higher than that of the I/O transistor. Therefore, the power amplifier 43 needs a high drain breakdown voltage.

Furthermore, since the power amplifier 43 included in the mobile terminal 40 is usually used in the frequency range about several hundreds MHz to several GHz, better high frequency characteristics (high-speed performance) are needed in addition to a high drain breakdown voltage. Furthermore, an easier integration with an I/O transistor and a core transistor is preferred to reduce manufacturing costs.

As has been described above, both the MIS transistors 1 and 30 meet these requirements, suited for the power amplifier 43. However, the MIS transistors 1 and are not limited to such a power amplifier 43, and widely applicable as a transistor included in various types of equipment.

The disclosed semiconductor device achieves breakdown voltage increase and on-resistance reduction at the same time, in addition to high frequency characteristics improvement.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that various changes, substitutions and alterations could be made hereto without departing from the spirit and scope of the invention.

What is claimed is:

1. A semiconductor device manufacturing method comprising:
    forming a first impurity region of a first conductivity type in a first region of a substrate;
    forming a first insulating film on the substrate and a gate electrode, that overlaps with an end portion of the first impurity region, on the first insulating film;
    forming a second impurity region of the first conductivity type in the substrate, opposite to the first impurity region;
    forming a second insulating film on a sidewall of the gate electrode and a third insulating film that is separated from the second insulating film on the first impurity region;
    forming a resist on a part of the gate electrode, a part of the first impurity region located between the second insulating film and the third insulating film, and the third insulating film;
    forming a third impurity region of a first conductivity type next to the first impurity region in the substrate and a fourth impurity region of the first conductivity type next to the second impurity region in the substrate using the resist as a mask, the third impurity region having an impurity concentration higher than an impurity concentration of the first region and an impurity concentration of the second impurity region, the fourth impurity region having an impurity concentration higher than the impurity concentration of the first region and the impurity concentration of the second impurity region;
    forming a silicide layer on a surface of the gate electrode, a surface of the part of the first impurity region, a surface of the third impurity region and a surface of the fourth impurity region.

2. The semiconductor device manufacturing method according to claim 1, further comprising forming a fifth impurity region of a second conductivity type, opposite to the first impurity region in the substrate before the forming of the second impurity region.

3. The semiconductor device manufacturing method according to claim 1, further comprising forming a fifth impurity region of a second conductivity type in the substrate before the forming of the first impurity region.

4. The semiconductor device manufacturing method according to claim 1, further comprising forming a silicide layer on a whole top surface of the gate electrode.

5. The semiconductor device manufacturing method according to claim 1, wherein the silicide layer formed on the surface of the part of the first impurity region is separated from the silicide layer formed on the surface of the third impurity region.

6. The semiconductor device manufacturing method according to claim 1, wherein the first impurity region is formed in a non-self-aligned manner with respect to the gate electrode so as to overlap with the end portion of the gate electrode.

7. The semiconductor device manufacturing method according to claim 1, wherein the second impurity region is formed in a self-aligned manner with respect to the gate electrode.

8. The semiconductor device manufacture method according to claim 1, wherein an impurity concentration of the surface of the part of the first impurity region is lower than an impurity concentration of the surface of the third impurity region.

9. The semiconductor device manufacture method according to claim 2, wherein:
 the fifth impurity region includes a first portion and a second portion below the gate electrode;
 the first portion is nearer to the first impurity region than the second portion; and
 an impurity concentration of the first portion is lower than an impurity concentration of the second portion.

\* \* \* \* \*